US008218684B2

(12) United States Patent
Chang et al.

(10) Patent No.: US 8,218,684 B2
(45) Date of Patent: Jul. 10, 2012

(54) METHOD AND SYSTEM FOR AN ADAPTIVE AUTOMATIC GAIN CONTROL (AGC) REFERENCE FOR HSDPA AND WCDMA

(75) Inventors: Li Fung Chang, Holmdel, NJ (US); Nelson Sollenberger, Farmingdale, NJ (US); Abhinav Prasad, Woodbridge, NJ (US)

(73) Assignee: Broadcom Corporation, Irvine, CA (US)

( * ) Notice: Subject to any disclaimer, the term of this patent is extended or adjusted under 35 U.S.C. 154(b) by 605 days.

(21) Appl. No.: 12/260,669

(22) Filed: Oct. 29, 2008

(65) Prior Publication Data

US 2009/0180578 A1    Jul. 16, 2009

Related U.S. Application Data

(60) Provisional application No. 61/021,162, filed on Jan. 15, 2008.

(51) Int. Cl.
*H04L 27/00* (2006.01)
(52) U.S. Cl. ........................................ 375/316
(58) Field of Classification Search .................. 375/259, 375/316, 324, 345; 379/387.02, 388.03, 379/395; 324/607; 341/126, 127, 128, 155, 341/156, 159; 342/92; 348/528, 678, 685; 359/341.41
See application file for complete search history.

(56) References Cited

U.S. PATENT DOCUMENTS

2003/0194029 A1   10/2003   Heinonen et al.
2007/0201587 A1*   8/2007   Sato .............................. 375/345
2007/0291880 A1*  12/2007   Ashkenazi .................... 375/345
2008/0014941 A1*   1/2008   Catovic et al. ................ 455/436
2009/0285144 A1*  11/2009   Motegi et al. ................. 370/312

FOREIGN PATENT DOCUMENTS

| CN | 1672377 A | 9/2005 |
| EP | 1881646 | 1/2008 |
| WO | WO02067420 | 8/2002 |
| WO | WO2004012410 | 2/2004 |

OTHER PUBLICATIONS

EPO Communication dated Apr. 15, 2011 in Application No. 08022386.0-2215 / 2081292.

* cited by examiner

*Primary Examiner* — Sam K Ahn
(74) *Attorney, Agent, or Firm* — Sterne, Kessler, Goldstein & Fox PLLC

(57) ABSTRACT

In a method and system for an adaptive automatic gain control (AGC) reference for HSDPA and WCDMA, A RF receiver, comprising a RF front-end, may receive a signal comprising a pilot signal via WCDMA or HSDPA. The operation mode of the RF front-end of the RF receiver may be determined based on the received signal components such as a HS-PDCH, a HS-SCCH, and/or a CPICH. The received signal strength information (RSSI) of the received signal may be determined from the output of a matched filter within the RF receiver. A true RSSI, which may be indicated by the received signal code power (RSCP), may be determined based on the pilot symbols over the CPICH. The operation mode determined for the receiver's RF front-end, the determined RSSI, and the determined CPICH_RSCP, may be provided as inputs to an automatic-gain-control (AGC) loop or circuit within the receiver front-end.

20 Claims, 4 Drawing Sheets

METHOD AND SYSTEM FOR AN ADAPTIVE AUTOMATIC GAIN CONTROL (AGC) REFERENCE FOR HSDPA AND WCDMA

CROSS-REFERENCE TO RELATED APPLICATIONS/INCORPORATION BY REFERENCE

This patent application makes reference to, claims priority to and claims benefit from U.S. Provisional Patent Application Ser. No. 61/021,162 filed on Jan. 15, 2008.

The above stated application is hereby incorporated herein by reference in its entirety.

FIELD OF THE INVENTION

Certain embodiments of the invention relate to signal processing for communication systems. More specifically, certain embodiments of the invention relate to a method and system for an adaptive automatic gain control (AGC) reference for HSDPA and WCDMA.

BACKGROUND OF THE INVENTION

The Wideband Code Division Multiple Access (WCDMA) is a technique used in the third generation (3G) wireless communication system based on and developed from Code Division Multiple Access (CDMA). WCDMA has evolved continuously towards higher data rates and towards packet-switched IP-based services. The High-speed Downlink Packet Access (HSDPA) technology has been designed to enhance WCDMA by increasing downlink packet data throughput via fast physical layer (L1) retransmission and transmission combining, as well as fast link adaptation controlled by the Node B, otherwise known as the Base Transceiver Station (BTS).

In WCDMA, three transport channels, Dedicated Channel (DCH), Downlink-shared Channel (DSCH), and Forward Access Channel (FACH), may be used for downlink packet data. The DCH may be used for any type of service in the downlink direction. The DSCH operated together with a DCH to define channel properties best suited for packet data needs while leaving the data with a tight delay budget, such as speech or video, to be carried by the DCH. The FACH can be used for downlink packet data as well. The FACH is operated normally on its own and sent typically at rather high power level to reach all users in the cell, owing to the lack of physical layer feedback in the uplink.

To implement the HSDPA feature, three new transport channels, High Speed Downlink-Shared Channel (HS-DSCH), High-speed Shared Control Channel (HS-SCCH), and Uplink High-Speed Dedicated Physical Control Channel (HS-DPCCH), are introduced in the physical layer specifications. The HS-DSCH carries the user data in the downlink direction, with the peak rate reaching up to, for example, 10 Mbps with 16 QAM (quadrature amplitude modulation). The HS-SCCH carries the necessary physical layer control information to enable decoding of the data on the HS-DSCH and to perform the possible physical layer combining of the data sent on the HS-DSCH in the case of retransmission of an erroneous packet. The HS-DPCCH carries the necessary control information in the uplink, namely, downlink quality feedback information, for example.

In WCDMA/HSDPA system, transmissions from a single source are separated by various channelization codes. The channelization codes of WCDMA/HSDPA are based on the Orthogonal Variable Spreading Factor (OVSF) technique. The use of OVSF codes allows the channelization codes to be changed and orthogonality between different channelization codes of different lengths to be maintained.

Various signaling information is communicated between the network and the terminals. The common pilot channel (CPICH) is an un-modulated code channel, which is scrambled with the cell-specific primary scrambling code, in order to provide channel estimation at a terminal or user equipment (UE). The CPICH is measured at the terminal to enable features such as handover and cell selection and/or reselection. The quantities defined that can be measured by the terminal from the CPICH are Received Signal Code Power (RSCP), Received energy per chip in the band (Ec/N0).

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A method and/or system for an adaptive automatic gain control (AGC) reference for HSDPA and WCDMA, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for an adaptive automatic gain control (AGC) reference for HSDPA and WCDMA. Various aspects of the invention may enable a RF receiver, which may comprise a RF front-end, to receive a transmission signal comprising a pilot signal via WCDMA or HSDPA. The operation mode of the RF front-end of the RF receiver may be determined based on the received signal component(s) such as a HS-PDCH, a HS-SCCH, and/or a CPICH. The received signal strength information (RSSI) of the received signal may be determined from the output of an ADC. True received signal strength information, which may be indicated by the received signal code power (RSCP), may be determined based on the pilot symbols over the CPICH. The operation mode determined for the RF front-end of the RF receiver, the determined RSSI, and the determined CPICH_RSCP, may be provided as inputs to an automatic-gain-control (AGC) loop or circuit within the receiver front-end. The AGC loop or circuit may be operable to determine an AGC gain based on the provided information. The determined AGC gain may be used to adjust the input signal power of an analog-to-digital controller (ADC) within the receiver front-end. Moreover, in instances when the RF receiver may operate in a HSDPA mode, the AGC gain may be determined based on a speed of the mobile terminal or user equipment (UE), in addition to the RSSI and determined CPICH_RSCP information. Various target values or thresholds may be selected for the RSSI and the CPICH_RSCP based on the operating mode of the RF receiver. The input signal power of the ADC may be adjusted in responsive to the comparisons of the determined RSSI and CPICH_RSCP with the perspective thresholds, accordingly.

Figure 1:
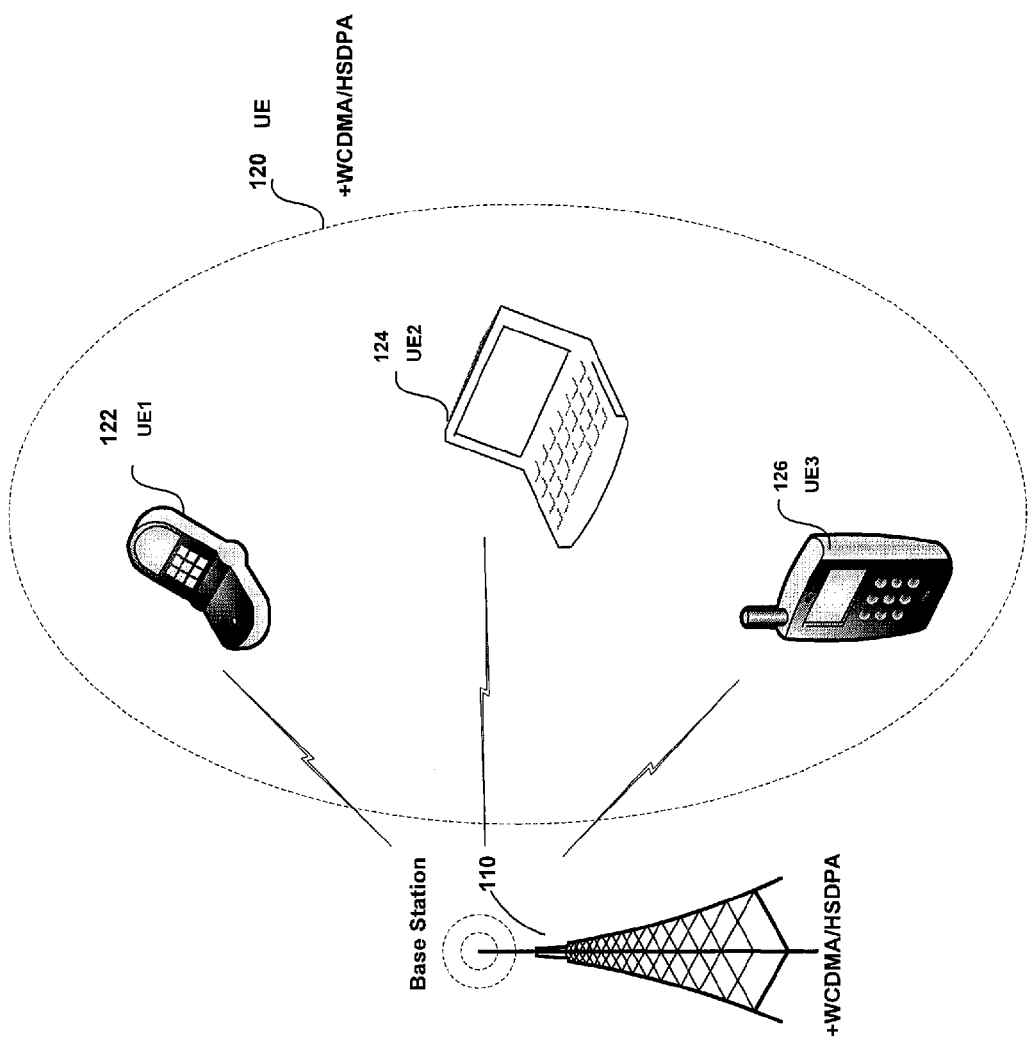
FIG. 1 is a diagram illustrating a portion of a cellular wireless communication system that supports wireless terminals operating, in accordance with an embodiment of the invention.

FIG. 1 is a diagram illustrating a portion of a cellular wireless communication system that supports wireless terminals operating, in accordance with an embodiment of the invention. Referring to FIG. 1, there is shown a base station 110, a plurality of user equipment (UE) 120, of which UE1 122, UE2 124, and UE3 126.

The base station 110 may comprise suitable logic, circuitry and/or code that may enable scheduling of communication resources in an uplink direction and/or downlink direction to various user equipment (UE) such as, for example, UEs 122-126. The base station 110 may receive and/or transmit radio frequency signals from and/or to UEs in a W-CDMA radio network. The base station 110 may be capable of supporting HSDPA and other downlink technologies.

The UE 120 may comprise suitable logic circuitry and/or code that may be enabled to receive and/or transmit radio frequency signals from and/or to the base station 110 across a W-CDMA radio network. The UE 120 may be enabled to transmit radio signals to the base station 110 and/or receive radio signals transmitted from the base station 110. The UE 120 may receive radio signals in either a WCDMA mode or a HSDPA mode. An automatic gain control (AGC) loop may be designed and digitally implemented in the UE 120 to ensure the power of the received radio signals to the UE 120 fall within the dynamic range of an associated analog-to-digital converter (ADC) within the UE 120. The AGC loop may be implemented based on a feedback architecture and an AGC gain control algorithm may be enabled to adjust gain by using various targets such as a Received Signal Code Power (RSCP) over the common pilot channel (CPICH) and/or a Received Signal Strength Indicator (RSSI). The targets may be selected depending on the operating mode (the receive mode), whether WCDMA or HSDPA, in which the UE 120 may be functioning. In instances where the UE 120 may be in a HSDPA mode, the RSSI target and CPICH_RSCP target may depend on UE speed. Accordingly, different RSSI targets and CPICH_RSCP targets may be established for different speeds.

In operation, a radio frequency signal may be transmitted via WCDMA or HSPDA technology from the base station 110 to the UE 120 such as the cell phone 122. The UE 120 may be enabled to use an AGC loop to adjust the power of the received radio signal within a dynamic range of the ADC inside the UE 120. The AGC loop may be adapted to a particular receive operation mode of the UE 120, whether WCDMA or HSDPA, respectively. Moreover, both the RSSI target and the CPICH_RSCP target may be utilized to adaptively adjust the AGC loop. In scenario such as a lightly-loaded cell with HSDPA transmission, the use of the both RSSI target and the CPICH_RSCP target to control AGC loop prevents the large power variation from HSDPA on-off traffic pattern since CPICH_RSCP will be relative constant regardless of the HSDPA transmission. The avoidance of the large change in gain alleviates instability of the AGC loop and thus reduces disruptions of other loops in the baseband modem. In instances when a HSDPA mode may be active, the RSSI target and the CPICH_RSCP target may be selected based on the user speed.

Figure 2:
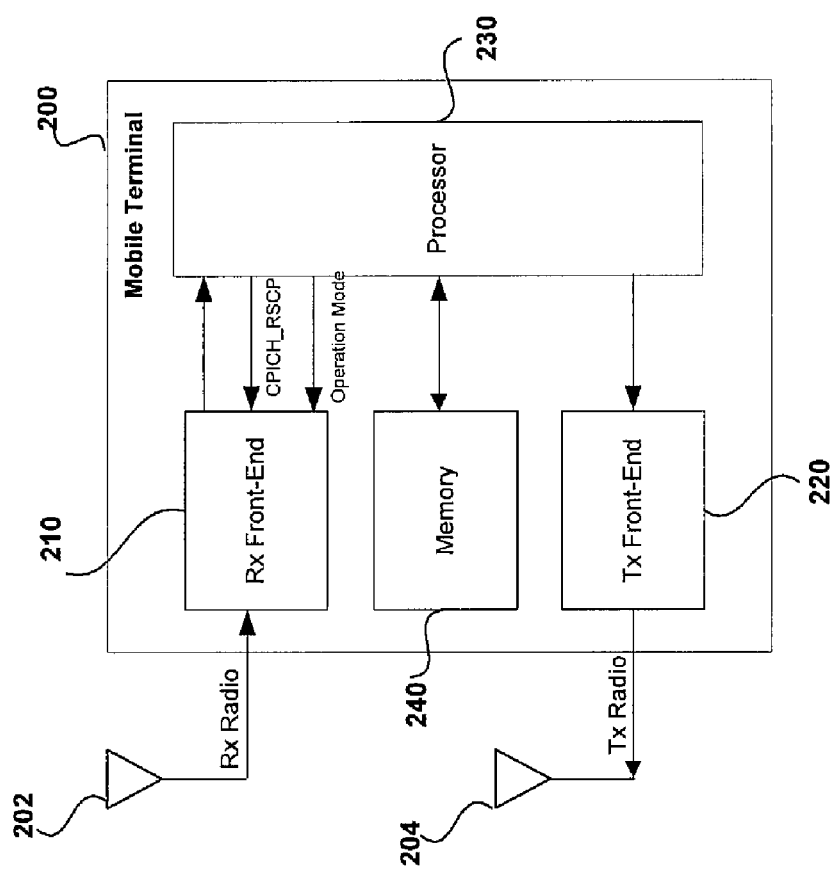
FIG. 2 is a block diagram illustrating an exemplary mobile terminal, in accordance with an embodiment of the invention.

FIG. 2 is a block diagram illustrating an exemplary mobile terminal, in accordance with an embodiment of the invention. Referring to FIG. 2, there is shown a mobile terminal 200 that may comprise a receive front-end (Rx front-end) 210, a transmit front-end (Tx front-end) 220, a processor 230, and a memory 240. A receive antenna 202 may be communicatively coupled to the Rx front-end 210. A transmit antenna 204 may be communicatively coupled to the Tx front-end 220.

The Rx front-end 210 may comprise suitable logic, circuitry, and/or code that may enable processing of received RF signals. The Rx front-end 210 may enable conversion of the received RF signal to a baseband frequency signal and may enable analog-to-digital conversion (ADC) of the baseband signal components. The digital baseband signal may be processed via an AGC loop or circuit and a pulse shaping circuit. In this regard, the AGC loop or circuit may be adjusted based on the mode of operation (receive mode of WCDMA or HSDPA), received signal strength information (RSSI), and the true received signal strength, as indicated by the pilot signal-to-noise ratio such as CPICH_RSCP. The Rx front-end 210 may use different targets such as RSSI and CPICH_RSCP to enable the AGC loop to accommodate the receive operation mode of the Rx front-end 210 for adaptively adjusting the power of the received RF signals. Moreover, the targets for RSSI and CPICH_RSCP may be determined based on UE speed when HSDPA may be active.

The Tx front-end 220 may comprise suitable logic, circuitry, and/or code that may enable processing of RF signals for transmission. The Tx front-end 220 may enable digital-to-analog conversion of the baseband signal components received from the processor 230. The Tx front-end 220 may perform direct up conversion of the baseband signal components to a designated frequency band signal.

The processor 230 may comprise suitable logic, circuitry, and/or code that may enable control and/or data processing operations for the mobile terminal 200. The processor 230 may enable processing and/or handling of signals in frequency domain as well as time domain. In this regard, the processor 230 may process signals from the Rx front-end 210 in baseband and/or handle signals to be transferred to the Tx front-end 220 for transmission to the network. The processor 230 may provide control and/or feedback information to the Rx front-end 210 and/or the Tx front-end 220 based on, for example, information from the processed signals. In this regard, the processor 230 may enable de-spreading the received signal and identifying the operating mode of the Rx front-end 210 based on, for example, the channelization codes used for the de-spreading. Moreover, the processor 230 may enable extraction of pilot symbols over the CPICH and calculating of a received signal code power based the extracted pilot symbols (CPICH_RSCP). The CPICH-RSCP may be a measure of the true received signal strength.

The information on the operation mode (receive mode) and CPICH_RSCP generated by the processor 230 may be provided to the Rx front-end 210 to be used for an adaptive AGC. The processor 230 may generate at least one signal for controlling operations within the mobile terminal 220. The processor 230 may enable execution of code and/or applications that may be utilized by the mobile terminal 200 to enable WCDMA and/or HSDPA communication. For example, the processor 230 may execute applications or code that may enable displaying and/or interacting with content received via WCDMA or HSDPA transmission signals in the mobile terminal 200. Moreover, in instances when HSDPA may be active, the processor 230 may be operable to determine a speed of the mobile terminal 200 and communicate it to the Rx front-end 210 for the adaptive AGC gain adjustment.

The memory 240 may comprise suitable logic, circuitry, and/or code that may enable storage of data and/or other information utilized by the mobile terminal 200. For example, the memory 240 may be utilized to store processed data generated by the processor 230. The memory 240 may also be utilized to store information, such as device configuration information, that may be utilized to control the operation of the mobile terminal 200. For example, the memory 240 may comprise information necessary to configure Rx front-end 210 to enable receiving RF signals with WCDMA or HSDPA transmission in the appropriate frequency bands. The memory 240 may store some executable instructions comprising algorithms that may be used to calculate, for example, CPICH_RSCP, various baseband processing such as de-spreading and channel decoding. One or more parameters which may be utilized to configure various components within the mobile terminal 200, including but not limited to Rx front-end 210, may be stored in the memory 240. The memory 240 may comprise RAM, ROM, low latency nonvolatile memory such as flash memory and/or other suitable electronic data storage.

In operation, the Rx front-end 210 of the mobile terminal 200 may enable receiving of various RF transmission signals via WCDMA or HSDPA. The Rx front-end 210 may convert the received RF signal into a baseband signal and enable analog to digital conversion of the baseband signal components. The digital baseband signal may be processed via an AGC loop or circuit. The AGC loop or circuit may be adaptively adjusted based on the RSSI as well as the control information provided by the processor 230. The control information from the processor 230 may comprise the true received signal strength CPICH-RSCP, the operation mode of the Rx front-end 210, and/or used speed when HSDPA may be active. The processor 230 may use various algorithms stored in the memory 240 for generating the control information to the AGC loop or circuit. The processed digital baseband signal from the Rx front-end 210 may be made accessible to the processor 230, via for example the memory 240, and may be utilized by one or more applications executed by the processor 230.

Figure 3:
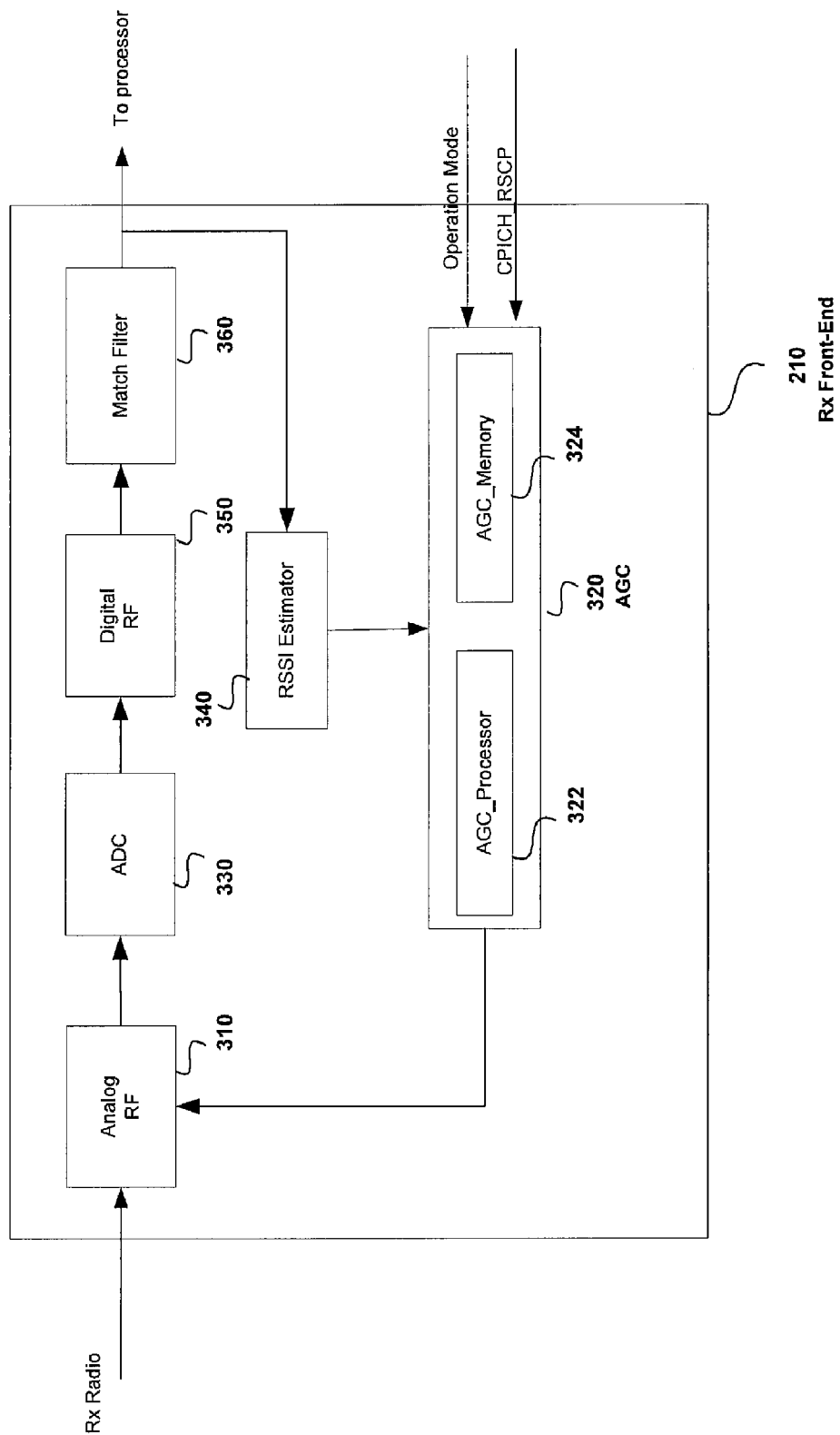
FIG. 3 is a block diagram illustrating an exemplary receiver front-end, in accordance with an embodiment of the invention.

FIG. 3 is a block diagram illustrating an exemplary receiver front-end, in accordance with an embodiment of the invention. Referring to FIG. 3, there is shown a Rx front-end 210 that may comprise an analog RF section 310, an AGC circuit 320, a ADC (analog-to-digital conversion) 330, a RSSI estimator 340, a digital RF section 350, and a match filter 360. The AGC circuit 320 may comprise an AGC_processor 322 and an AGC_memory 324, respectively.

The analog RF 310 may comprise suitable logic, circuitry and/or code that enable various analog RF functions such as LNA (Low Noise Amplifier), Mixer, and/or low pass filters. For example, an AGC gain adjustment may be implemented via controlling the LNA/Mixer gain setting.

The ADC 330 may comprise suitable logic, circuitry, and/ or code that may enable analog-to-digital conversion (ADC) of the received radio frequency signal. The power of the input signal to the ADC 310 may be adaptively adjusted by the analog RF 310 in response to an AGC gain determined via various AGC algorithms executed by, for example, the processor 230.

The AGC circuit 320 may comprise suitable logic, circuitry, and/or code that may enable scaling of the signal level at the input of the ADC 330 to be the same irrespective of the original amplitude of the received radio frequency signal. The AGC circuit 320 may be operable to determine the AGC gain to amplify or attenuate the input signals to the ADC 330 in order ensure operation within a dynamic range of the ADC 330. To determine the correct AGC gain, an estimate of the received signal strength information, the true received signal strength information, the operation mode of the Rx front-end 210, and/or the mobile terminal speed may be utilized.

The AGC_processor 322 of the AGC circuit 320 may comprise suitable logic, circuitry and/or code that may enable generation of control signal to enable adjustment of the power of the input signal to the ADC 330 so as to ensure operation within the dynamic range of the ADC 310. The AGC_processor 322 may be enabled to determine the AGC gain based on the operation mode of the Rx front-end 210, the received signal strength information (RSSI), and the true received signal strength, as indicated by CPICH_RSCP. The determined AGC gain may be fed to the analog RF 310 to apply gain adjustment to the received signal. The output of the analog RF 310 after AGC gain adjustment may be passed to the ADC 330. In addition, when HSDPA may be active, the speed of the mobile terminal may be utilized to determine the AGC target.

The AGC_memory 324 may comprise suitable logic, circuitry, and/or code that may enable storing of information such as executable instructions and data that may be utilized by the AGC_processor 322. The executable instructions may comprise algorithms that may enable the generation of CPICH_RSCP and/or the determination of the AGC gain intelligently. The AGC_memory 324 may comprise RAM, ROM, low latency nonvolatile memory such as flash memory and/or other suitable electronic data storage.

The digital RF section 350 may comprise suitable logic, circuitry, and/or code that may enable sampling rate decimation via using, for example, decimation filters and rate conversion.

The match filter 360 may comprise suitable logic, circuitry, and/or code that may enable matched filtering based on, for example, a Square-Root Raised Cosine pulse shape with 100% excess bandwidth. The match filter 360 may be used to restrict the baseband bandwidth of the received radio signal to an expected frequency and attenuate emissions outside a service provider's frequency block.

The RSSI estimator 340 may comprise suitable logic, circuitry, and/or code that may be operable to determine an estimate of the received signal strength, as indicated by RSSI. Various algorithms may be used for accurately estimating the RSSI for the received signal. The RSSI estimator 340 may forward the estimated RSSI to the AGC_processor 322 to calculate an analogue gain for signal receiving.

In operation, a communication signal transmitted via WCDMA or HSDPA may be received by the antenna 202 and communicated to the Rx front-end 210. The analog RF 310 is enabled to adjust the strength of the received signal via an AGC gain. The ADC 310 may enable analog-to-digital conversion (ADC) of the received radio signal. The AGC gain may be determined by the AGC_processor 322 based on the total received signal strength, the received pilot signal strength, as indicated by CPICH_RSCP, the operation mode of the Rx front-end 210, and the user speed when HSDPA may be active. The RSSI may be estimated at the RSSI estimator 340 and may be forwarded to the AGC_processor 322. The CPICH_RSCP, the operation mode of the Rx front-end 210, and/or the user speed may be provided by the processor 230 of the mobile terminal 200. The AGC_processor 322 may pass the determined AGC gain to the analog RF 310 to intelligently adjust the amplitude of the input signal, accordingly.

The AGC processed signal may be passed to the match filter 360 and may be forwarded to the processor 230 for a particular application executed by the processor 230, accordingly.

Figure 4:
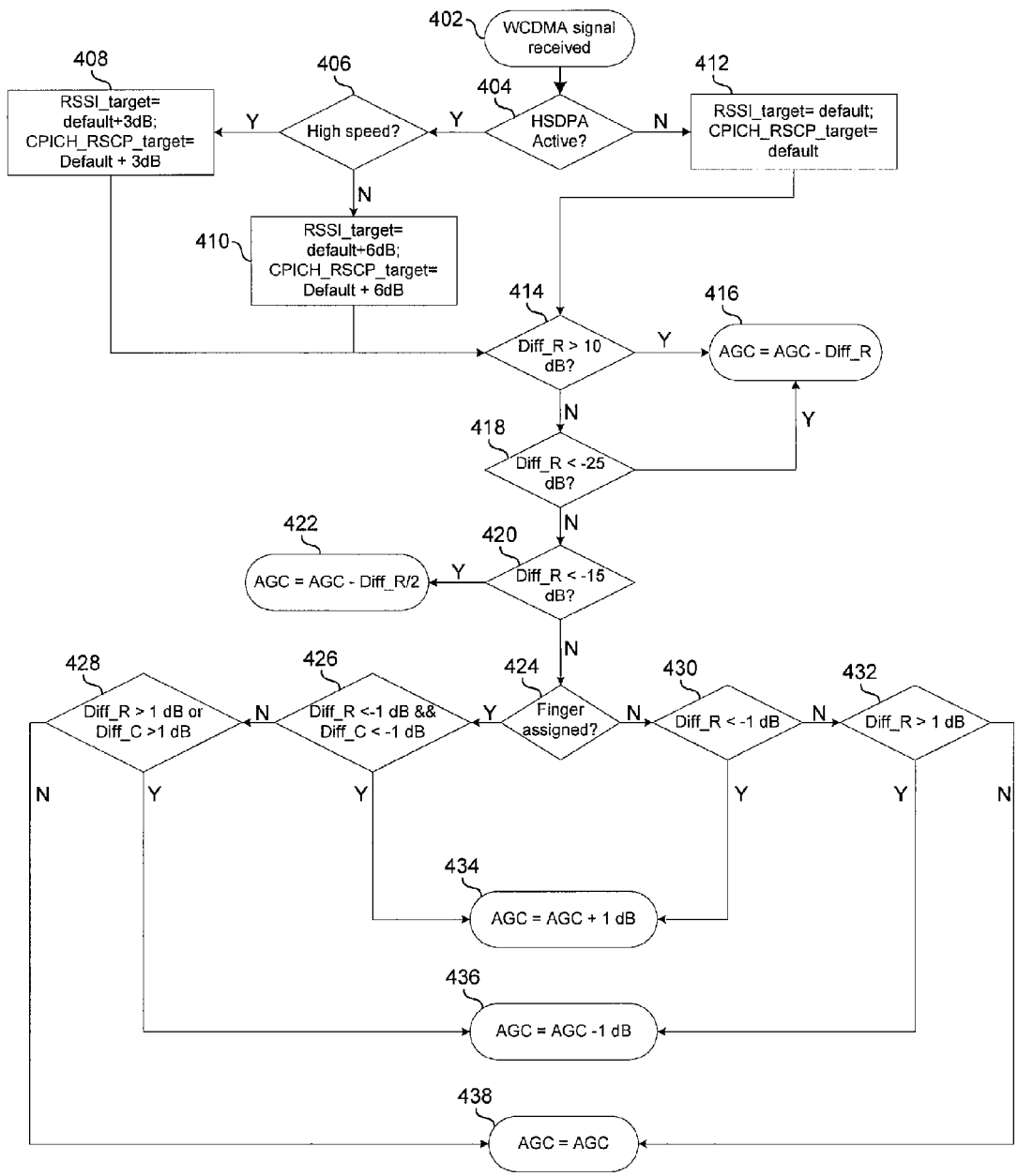
FIG. 4 is a flow chart that illustrates exemplary steps for an adaptive AGC for a HSDPA and WCDMA Rake receiver, in accordance with an embodiment of the invention.

FIG. 4 is a flow chart that illustrates exemplary steps for an adaptive AGC for a HSDPA and WCDMA Rake receiver, in accordance with an embodiment of the invention. The parameters used in the AGC algorithm may be listed in Table 1.

TABLE 1

AGC Algorithm Parameter List

| Parameters | Definitions |
| --- | --- |
| RSSI | Received Signal Strength Indicator (RSSI), which is the wideband received power within the channel bandwidth. |
| RSSI_measured | Measured RSSI |
| RSSI_target | Target RSSI in AGC |
| RSSI_default | Default value for RSSI |
| Diff_R | Diff_R = RSSI_measured − RSSI_target |
| CPICH | Common pilot channel |
| RSCP | Received Signal Code Power, which is the received power on one code after despreading, defined on the pilot symbols. |
| CPICH_RSCP | Representing RSCP performed from the common pilot channel (CPICH) |
| CPICH_RSCP_measured | Measured CPICH_RSCP |
| CPICH_RSCP_target | Target CPICH_RSCP in AGC |
| RSCP_default | Default value for RSCP |
| Diff_C | Diff_C = CPICH_RSCP_measured − CPICH_RSCP_target |
| AGC | AGC gain |

Referring to FIG. 4, the exemplary steps may begin in step 402, where a WCDMA signal transmitted via WCDMA or HSDPA may be received by the Rx front-end 210 of the mobile terminal 200. In step 404, the processor 230 may assess the received WDMA signal to determine the operation mode of the Rx front-end 210. This may be achieved by evaluating, for example, the channel specific codes used for the perspective physical channels associated with the received WCDMA signal. In instances where the Rx front-end 210 may operate in a HSDPA mode, then in step 406, the speed of the mobile terminal 200 may be evaluated. In instances where the speed of the mobile terminal may be high, then in step 408, the RSSI target and CPICH_RSCP target may be set up with a determined target step size such as 3 dB as:

$RSSI\_target=RSSI\_default+3$ dB; and $CPICH\_RSCP\_target=RSCP\_default+3$ dB, where the RSSI_default and CPICH_RSCP_default and associated target step sizes may be implementation dependent and may be set differently for RSSI_target and CPICH_RSCP_target, respectively. Although the term high is utilized, it should be recognized that one or more thresholds or values may be utilized to determine what is meant by high.

In step 414, the Diff_R may be compared to the first RSSI threshold of, for example, 10 dB. In instances where Diff_R may be greater than, for example, 10 dB, then in step 416, the AGC gain may be selected to be:

$AGC=AGC-\text{Diff}\_R$, which may indicate a full AGC compensation applied to adjust the power of the input signal to the ADC 310.

In step 414, in instances where the Diff_R may be less than or equal to 10 dB, then in step 418, where the Diff_R may be compared to the second RSSI threshold of, for example, −25 dB. In instances where Diff_R may be greater than or equal to, for example, −25 dB, then in step 420, where the Diff_R may be compared to the third RSSI threshold of, for example, −15 dB. In instances where Diff_R may be greater than or equal to, for example, −15 dB, then in step 424, where the Rake receiver finger assignments status at the receiver of UE such as UE 1 may be checked. In instances where fingers of the Rake receiver of the UE 1 may have been assigned to process the received WCDMA signal, then in step 426, where Diff_R may be compared to the fourth RSSI threshold of, for example, −1 dB and Diff_C may be compared to the first RSCP threshold of, for example, −1 dB.

In instances where the Diff_R may be, for example, less than −1 dB and the Diff_C may be, for example, less than −1 dB, then in step 434, where the AGC gain may be increased by, for example, 1 dB. That is:

$AGC=AGC+1$ dB.

In step 426, in instances where the Diff_R may be, for example, greater than or equal to −1 dB and/or the Diff_C may be, for example, greater than or equal to −1 dB, then in step 438, the Diff_R may be compared to the fifth RSSI threshold of, for example, 1 dB and then Diff_C may be compared to the second RSCP threshold of, for example, 1 dB. In instances where the Diff_R may be, for example, greater than 1 dB or the Diff_C may be, for example, greater than 1 dB, then in step 436, the AGC gain may be reduced by a determined value such as 1 dB. This is:

$AGC=AGC-1$ dB.

In step 428, in instances where the Diff_R may be, for example, less than or equal to 1 dB and the Diff_C may be, for example, less than or equal to 1 dB, then in step 438, the AGC gain may remain unchanged. In step 424, in instances where fingers of the receiver of the UE 1 were not assigned to process the received WCDMA signal, then in step 430, the Diff_R may be compared to the fourth RSSI threshold of, for example, −1 dB. In instances where Diff_R may be less than −1 dB, then go to step 434.

In step 430, in instances where the Diff_R may be, for example, greater than or equal to −1 dB, then in step 432, the Diff_R may be compared to the fifth RSSI threshold of, for example, 1 dB. In instances where the Diff_R may be greater than 1 dB, then in step 436. In step 432, in instances where Diff_R may be less than or equal to 1 dB, then go to step 438. In step 420, in instances where the Diff_R may be greater than or equal to, for example, −15 dB, then in step 422, the AGC gain may be selected to be:

$AGC=AGC-\text{Diff}\_R/2$, which may indicate that a half AGC compensation may be applied to adjust the power of the input signal to the ADC 310.

In step 418, in instances where the Diff_R may be, for example, less than −25 dB, then in step 416. In step 406, in instances where the user speed may not be high, then in step 410, the RSSI target and the CPICH_RSCP target may be set up with a determined target step size such as 6 dB as follows:

$RSSI\_target=RSSI\_default+6$ dB; and $CPICH\_RSCP\_target=RSCP\_default+6$ dB, respectively.

where the RSSI_default and CPICH_RSCP_default and associated target step sizes may be implementation dependent and may be set differently for RSSI_target and CPICH_RSCP_target, respectively. The next step may be step 414.

In step 404, in instances where the Rx front-end 210 may operate in a pure WCDMA mode, then in step 412, the RSSI target and CPICH_RSCP target may be set as: follows:

$RSSI\_target = RSSI\_default$; and $CPICH\_RSCP\_target = RSCP\_default$, respectively.

Aspects of a method and system for an adaptive AGC reference for HSDPA and WCDMA are provided, in which the Rx front-end 210 of the mobile terminal 200 may be operable to receive a transmitted signal in conjunction with a corresponding pilot signal via WCDMA and/or HSDPA. The operation mode of the Rx front-end 210 may be determined by the processor 230 via, for example, the unique channel codes used to separate the signal components such as HS-PDCH, HS-SCCH, and CPICH. The received signal strength information (RSSI) of the received signal may be determined from the output of the matched filter 360. The RSSI estimator 340 may estimate the RSSI based on the output of the matched filter 360 via various algorithms. The received signal strength information, which may be independent of the HSDPA traffic pattern, may be determined by the processor 230 based on the pilot symbols over the CPICH. The CPICH_RSCP may be calculated by using various algorithms and/or instructions stored in the memory 240.

The determined information on the operation mode of the Rx front-end 210, the RSSI, and the CPICH_RSCP may be provided to the AGC circuit 320 within the Rx front-end 210. The AGC circuit 320 may determine an AGC gain based on the provided information. The determined AGC gain may be applied to the analog RF 310 to adaptively adjust the input signal power of the ADC 330, accordingly. When the Rx front-end 210 may operate in a HSDPA mode, the AGC gain may be selected based on the speed of the Rx front-end 210. As described in FIG. 4, the estimated RSSI and the calculated CIPCH_RSCP may be compared with perspective thresholds, respectively, and the input signal power of the ADC 330 may be adaptively adjusted, accordingly. The thresholds may be implementation dependent and may be pre-selected based on the different operation mode of the Rx front-end 210. The thresholds may also vary adaptively based on, for example, determined channel conditions.

Another embodiment of the invention may provide a machine and/or computer readable storage and/or medium, having stored thereon, a machine code and/or a computer program having at least one code section executable by a machine and/or a computer, thereby causing the machine and/or computer to perform the steps as described herein for an adaptive automatic gain control (AGC) reference for HSDPA and WCDMA.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for processing signals, the method comprising:
receiving a wireless signal and a corresponding pilot signal by a wireless receiver;
determining signal strength information of said wireless signal;
determining an air-interface specific operating mode of said wireless receiver associated with said reception of said received wireless signal; and
adaptively adjusting a gain of an automatic gain control (AGC) circuit within said wireless receiver based on said signal strength information and air-interface specific operating mode.

2. The method according to claim 1, wherein said receiving comprises receiving a wireless signal transmitted via a Wideband CDMA (W-CDMA) operating mode or High-Speed Downlink Packet Access (HSDPA) operating mode.

3. The method according to claim 1, wherein said determining said air-interface specific operating mode comprises determining said air-interface operating mode as being a WCDMA operating mode or an HSDPA operating mode.

4. The method according to claim 1, wherein said determining said signal strength information comprises determining received signal strength information (RSSI) and received signal code power (RSCP) strength of said wireless signal.

5. The method according to claim 1, wherein said determining said received signal strength information comprises processing an output from a match filter within said wireless receiver, wherein said match filter is operable to process a digital RF signal from an output of an analog-to-digital conversion (ADC).

6. The method according to claim 4, wherein said determining said received signal code power (RSCP) strength of said wireless signal comprises determining said received signal code power (RSCP) strength from said corresponding pilot signal.

7. The method according to claim 4, wherein determining said signal strength information of said wireless signal comprises comparing said received signal strength information of said wireless signal and said received signal code power strength from said corresponding pilot signal of said wireless signal with selected threshold values.

8. The method according to claim 7, wherein said adaptively adjusting comprises adaptively adjusting an analog-to-digital conversion (ADC) within said wireless receiver based on said comparison.

9. The method according to claim 7, wherein said comparing comprises selecting said threshold values based on said air-interface specific operating mode of said wireless receiver.

10. The method according to claim 1, wherein said adaptively adjusting comprises adaptively adjusting an analog-to-digital conversion (ADC) within said wireless receiver based on a speed of said wireless receiver, when said wireless receiver is in a HSDPA operating mode.

11. A system for processing signals, the system comprising:
one or more circuits in a wireless receiver, wherein said one or more circuits are operable to receive a wireless signal and a corresponding pilot signal by a wireless receiver;
said one or more circuits are operable to determine signal strength information of said wireless signal and to determine an air-interface specific operating mode of said wireless receiver associated with said reception of said received wireless signal; and
said one or more circuits are operable to adaptively adjust a gain of an automatic gain control (AGC) circuit within said wireless receiver based on said signal strength information and air-interface specific operating mode.

12. The system according to claim 11, wherein said signal is transmitted via a Wideband CDMA (W-CDMA) operating mode or High-Speed Downlink Packet Access (HSDPA) operating mode.

13. The system according to claim 11, wherein said air-interface specific operating mode of said wireless receiver is a WCDMA operating mode or an HSDPA operating mode.

14. The system according to claim 11, wherein said signal strength information of said wireless signal comprises received signal strength information (RSSI) and received signal code power (RSCP) strength.

15. The system according to claim 11, wherein said one or more circuits are operable to determine said received signal strength information of said wireless signal from an output of a match filter within said wireless receiver, wherein said match filter is operable to process a digital RF signal from an output of an analog-to-digital conversion (ADC).

16. The system according to claim 14, wherein said one or more circuits are operable to determine said received signal code power (RSCP) strength from said corresponding pilot signal.

17. The system according to claim 14, wherein said one or more circuits are operable to compare said received signal strength information of said wireless signal and said received signal code power strength from said corresponding pilot signal with selected threshold values.

18. The system according to claim 17, wherein said one or more circuits are operable to adaptively adjust an analog-to-digital conversion (ADC) within said wireless receiver based on said comparison.

19. The system according to claim 17, wherein said one or more circuits are operable to select said threshold values based on said air-interface specific operating mode of said wireless receiver.

20. The system according to claim 11, wherein said one or more circuits are operable to adaptively adjust an analog-to-digital conversion (ADC) within said wireless receiver based on a speed of said wireless receiver, when said wireless receiver is in a HSDPA operating mode.

* * * * *